United States Patent [19]

Foster et al.

[11] Patent Number: 5,378,501
[45] Date of Patent: Jan. 3, 1995

[54] METHOD FOR CHEMICAL VAPOR DEPOSITION OF TITANIUM NITRIDE FILMS AT LOW TEMPERATURES

[76] Inventors: Robert F. Foster, 5002-3 E. Siesta Dr., Phoenix, Ariz. 85044; Joseph T. Hillman, 8025 E. McClellan Blvd., Scottsdale, Ariz. 07410

[21] Appl. No.: 131,900

[22] Filed: Oct. 5, 1993

[51] Int. Cl.⁶ ........................................ C23C 16/00
[52] U.S. Cl. ..................... 427/255.2; 427/255.1; 427/255; 427/255.5; 427/248.1; 427/314
[58] Field of Search .................. 427/255.2, 255.1, 255, 427/255.5, 248.1, 314

[56] References Cited

U.S. PATENT DOCUMENTS

| | | |
|---|---|---|
| 3,672,948 | 6/1972 | Foehring et al. . |
| 4,535,000 | 8/1985 | Gordon . |
| 4,570,328 | 2/1986 | Price et al. . |
| 4,574,093 | 3/1986 | Cox . |
| 4,800,105 | 1/1989 | Nakayama et al. . |
| 4,986,216 | 1/1991 | Ohmori et al. ............ 118/730 |
| 5,104,482 | 4/1992 | Monkowski et al. . |
| 5,173,336 | 12/1992 | Kennedy . |
| 5,186,756 | 2/1993 | Benko et al. . |

OTHER PUBLICATIONS

Pierson, "Handbook of Chemical Vapor Deposition (CVD), Principles, Technology and Applications", Noyes Publications (1992) pp. 225 and 263.
Coltrin, Michael E., et al., *A Mathematical Model of the Fluid Mechanics and Gas-Phase Chemistry in a Rotating Disk Chemical Deposition Reactor*, The Electrochemical Society, Inc., vol. 136, No. 3, Mar., 1989, pp. 819–829.
Hitchman, M. L. and Bernard J. Curtis, *Heterogeneous Kinetics and Mass Transfer in Chemical Vapour Deposition Processes: III. The rotating disc reactor*, Journal of Crystal Growth 60, 1982, pp. 57–66.
Hitchman Michael L. and Bernard J. Curtis, *Heterogeneous Kinetics and Mass Transport in Chemical Vapour Deposition Processes: Part II. Application to Silicon Epitaxy*, The Crystal Growth Charact., 1981, vol. 4, pp. 283–296.
McKee, M. A., et al., *Growth of Highly Uniform, Reproducible InGaAs Films in a Multiwafer Rotating Disk Reactor by MOCVD*, Journal of Crystal Growth 197, 1991, pp. 445–451.
Smith, Gregory C., *CVD Titanium Nitride Nucleation Layer for CVD Tungsten*, Conference Procedings, VLSI VI. 1991 Materials Research Society, pp. 267–273.
Tompa, G. S., et al., *A Parametric Investigation of GaAs Epitaxial Growth Uniformity in a High Speen, Rotating-Disk MOCVD Reactor*, Journal of Crystal Growth 93, 1988, pp. 220–227.

*Primary Examiner*—Roy V. King

[57] ABSTRACT

Titanium nitride film is deposited upon a semi-conductor substrate by chemical vapor deposition of titanium tetrachloride, ammonia and a diluent at temperatures less than 550° C. This is accomplished by minimizing the boundary layer thickness over the substrate.

9 Claims, 2 Drawing Sheets

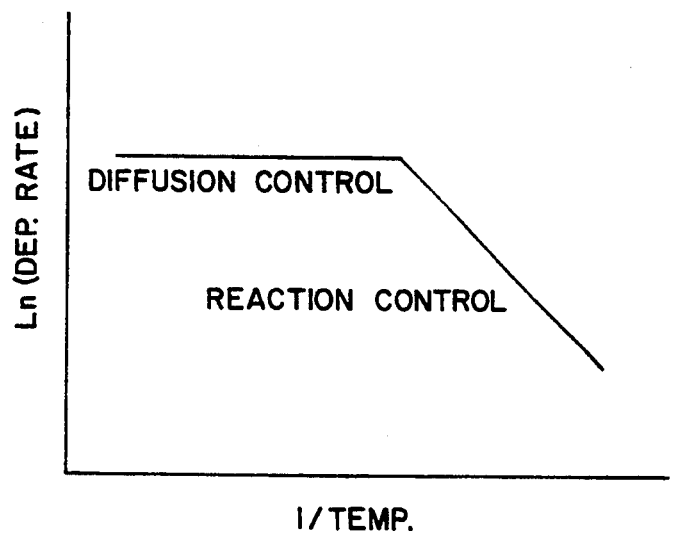
FIG. 1
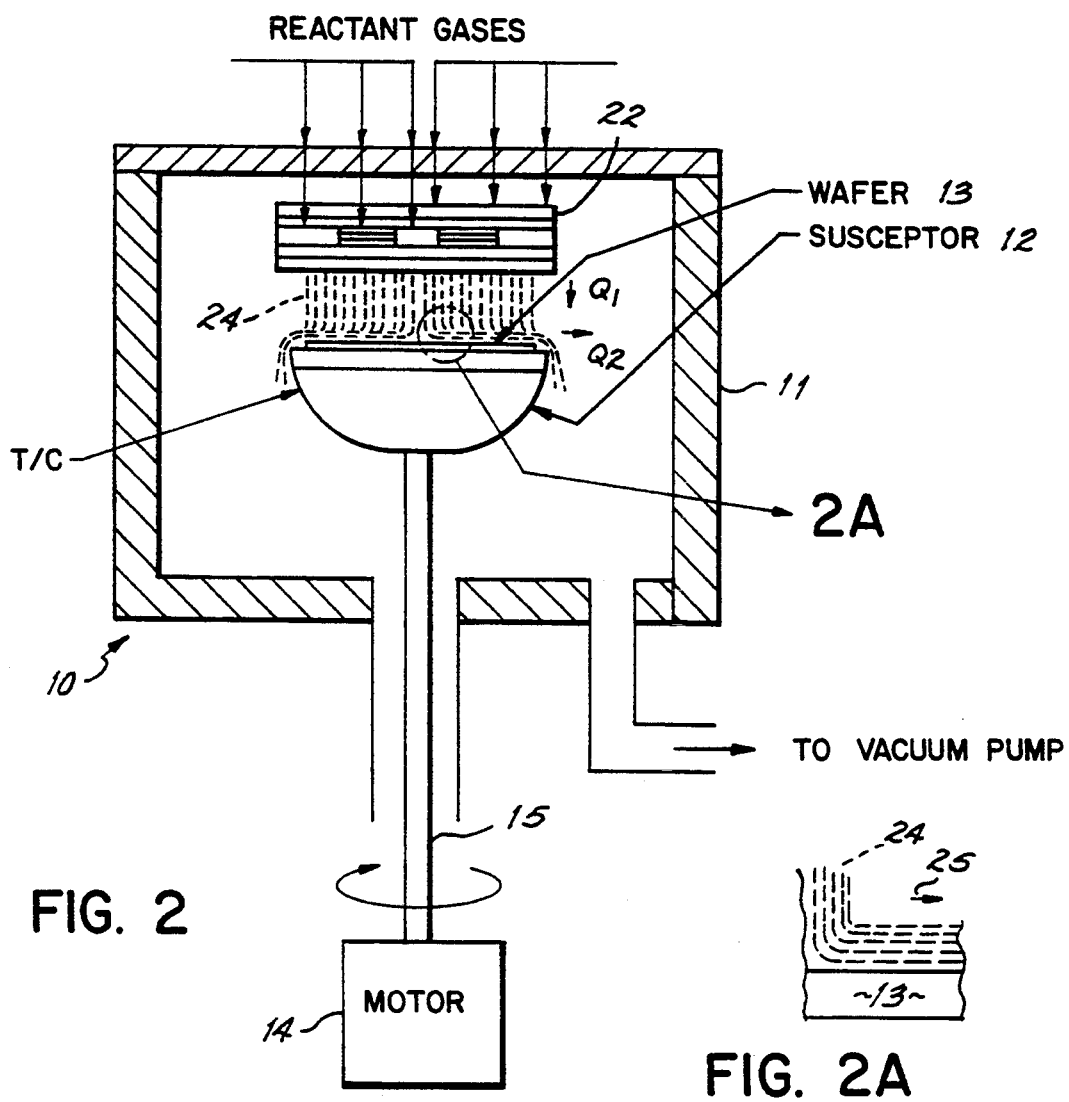
FIG. 2
FIG. 2A

METHOD FOR CHEMICAL VAPOR DEPOSITION OF TITANIUM NITRIDE FILMS AT LOW TEMPERATURES

BACKGROUND OF THE INVENTION

Thin film titanium nitride (TiN) is widely utilized throughout the integrated circuit industry as a diffusion barrier. A diffusion barrier is an inter-layer between the silicon contacts and the metal inter-connection. Its primary purpose is to prevent junction spiking failures which occur when a significant amount of metal diffuses into the silicon creating a short circuit across the junction. As contact dimensions shrink, this diffusion process is driven by high current density and higher local temperature making an effective diffusion barrier an essential part of the integrated circuit fabrication process.

Titanium nitride is also used as an adhesion layer or blanket tungsten films. In this application titanium nitride is deposited after contacts or vias are cut in the dielectric. Blanket tungsten is then deposited and etched back to form plugs which are coplanar with the top of the dielectric. Then aluminum is deposited and patterned to form the metal interconnection for the integrated circuit. This series of processes is usually repeated to form three or four levels of metalization.

There are three processes for depositing titanium nitride films. These are sputtering titanium onto a substrate and then reacting in nitrogen or ammonia, reactively sputtering titanium in a nitrogen ambient and chemical vapor deposition (CVD). The first two processes are physical and result in line of sight trajectories for the deposited material. As a result, coverage of the side walls and bottoms of high aspect ratio contacts is poor with respect to the top surface of the substrate. The third process, CVD, allows surface diffusion of the depositing species and so the coverage on the side walls and bottoms of the high aspect ratio contacts can be equivalent to that on the top surface of the substrate. An apparatus and method useful for such chemical vapor deposition of titanium nitride films is disclosed in pending applications *Methods of Chemical Vapor Deposition (CVD) of Films on Patterned Wafer Substrates*, Ser. No. 07/898,492 filed Jun. 15, 1992 and *Semiconductor Wafer Processing Method and Apparatus With Heat and Gas Glow Control*, Ser. No. 07/898,800 filed Jun. 15, 1992, the disclosures of which are incorporated herein by reference.

The excellent conformality which has been demonstrated by chemical vapor deposition from titanium tetrachloride and ammonia is usually accomplished at a temperature of 650° C. However, substantial benefits could be realized from this process if the deposition temperature could be reduced to less than 550° C. Reducing the deposition temperature to less than 550° C., and preferably 450° C., would make the deposition process compatible with aluminum metalization. A low temperature process such as this could be utilized not only to deposit diffusion barriers at the contact level, but also to deposit adhesion layers for blanket tungsten deposition at subsequent metalization levels without disturbing the underlying aluminum layers. There are also other metalization schemes which require a low temperature titanium nitride process.

In CVD deposition of titanium nitride, the reaction rate versus the reciprocal of temperature appears as a graph as shown in FIG. 1. This is also referred to as the Arrhenius plot. This graph shows two basically linear lines, a horizontal line which represents higher temperatures from about 600° C. and higher, and a sloped portion from 600° C. and lower. This horizontal portion is called the mass transfer portion where the deposition rate is limited by the mass transfer. The sloped portion is limited by the reaction rate. In this region, the reaction rate for titanium nitride deposition can be expressed by the following equation:

$$R = 3.48 \times 10^{-7} \exp(-4800/T) P^0 TiCl_4 P^2 NH_3$$

There are two problems which occur with chemical vapor deposition of titanium nitride at the reaction rate limited temperatures. The first of course, is the reaction rate itself. This can be slow, increasing deposition time. Also, and more importantly, at these lower reaction temperatures chlorine impurities remain in the deposited film. The chlorine impurities increase the resistance of the titanium nitride film. Also, the chlorine present in the deposited film corrodes metal, in particular aluminum, damaging the surface.

In a rotating reactor such as disclosed in co-pending application Ser. No. 07898,492 entitled *Method of Chemical Vapor Deposition (CVD) of Films on Patterned Wafer Substrates* filed Jun. 15, 1992, it is known that the reaction rate in the mass transfer region of the Arrhenius plot can be increased by increasing the rotation rate of the disk for certain CVD films. For example, *Heterogeneous Kinetics and Mass Transfer and Chemical Vapor Deposition Crystal Growth Characterization*, 1981 Vol. 4, pp. 283–296, discloses this phenomenon with respect to CVD deposition of tungsten silicon chloride. However, their findings showed that there was no increase in reaction rate in the reaction controlled portion of the Arrhenius plot for the deposition of Tungsten Silicon Chloride. Thus the rotation rate had no effect on the reaction rate at lower temperatures.

SUMMARY OF THE INVENTION

Accordingly, it is an object of the present invention to provide a method of depositing high quality titanium nitride films by low temperature chemical vapor deposition. More particularly, it is an object of the present invention to provide such films wherein the chlorine impurities are decreased and reaction rate is increased.

These objects and advantages of the present invention have been attained by chemical vapor deposition of titanium nitride at temperatures below 550° C. by maintaining the boundary layer thin enough to increase the reaction rate and decrease the chlorine impurity rate.

In a laminar flow reactor this is accomplished by increasing the velocity at which the reaction mixture passes over the substrate. In a rotating disk reactor this is accomplished by establishing matched flow conditions and modifying viscosity, temperature and flow rate to obtain the necessary thin boundary layer. The objects and advantages of the present invention will be further appreciated in light of the following detailed description and drawings in which:

BRIEF DESCRIPTION OF THE DRAWINGS

FIG. 1 is a graphic depiction of an Arrhenius plot;

FIG. 2 is a cross-sectional graphical depiction of a rotating disk reactor; and

FIG. 2A is an enlarged portion of FIG. 3.

DETAILED DESCRIPTION

Figure 4:
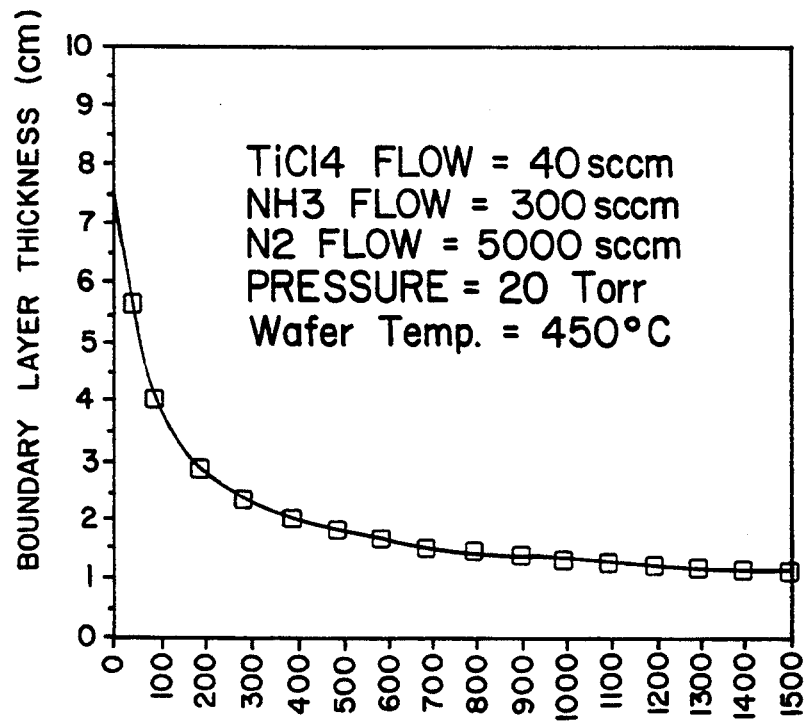
FIG. 4 is a graph depicting the reaction rate as a function of the boundary layer.

According to the present invention, titanium nitride films are deposited on semi-conductor wafers, semiconductor substrates or other substrates using a chemical vapor deposition reaction. In this reaction, titanium tetrachloride (TiCl$_4$) is reacted with ammonia gas in a diluent to form titanium nitride on the surface of the substrate. For purposes of the present invention, the substrate will include semiconductors such as silicon and patterned wafers. The method which is generally used to deposit a TiN film which may be from 50 to 5000 angstroms thick. The reaction temperature in the present invention will be less than 550° C., generally 500° C. to 350° C. and preferably about 450° C.

There are two basic reactors suitable for use in the present invention: a perpendicular flow reactor, where the flow of reactant gases are pumped from above the substrate directly down upon the substrate perpendicular to the plane of the substrate, and a laminar flow reactor where the gas passes parallel to the plane of the substrate.

With either type of reactor, the reaction rate will vary depending upon the reaction temperature. FIG. 1 shows a plot of the natural log of the reaction rate versus the reciprocal of the temperature. This is referred to as an Arrhenius plot. The Arrhenius plot shows two different reaction portions. The upper horizontal portion of the plot is the diffusion rate controlled regime. When the reaction temperature is very high the deposition rate is dependent upon the ability of the reactants to reach the surface of the substrate. This is also referred to as the mass transfer area. The lower portion or sloped portion of the Arrhenius plot is referred to as the kinetic reaction area or regime. In this area, the reaction rate is a function of the reaction kinetics and is extremely temperature variable. The rate itself is equal to:

$$3.48 \times 10^{-7} \exp(-4800/T) P^0 TiCl_4 P^2 NH_3$$

The present invention deals only with deposition of titanium nitride in the kinetic reaction regime.

The reaction itself employs three gases: titanium tetrachloride, ammonia and a diluent. The diluent will be an inert gas such as helium, argon, hydrogen or nitrogen. Generally, equimolar portions of titanium tetrachloride and ammonia are used in the present invention and generally a 10-fold excess of diluent. The total gas flow rate should be from 1 slm to about 50 slm and the inlet gas temperature should be about 150° C.

As shown more particularly in FIG. 2, the preferred reactor for the present invention is a rotating disk reactor. FIG. 2 shows a schematic representation of the pertinent portions of a rotating disk reactor suitable for practicing the present invention. As shown in FIG. 2, the rotating disk reactor 10 has a rotating susceptor 12 which supports a patterned wafer substrate 13. The susceptor and thus the substrate 13 are rotated in a clockwise direction by means of a motor 14 which drives shaft 15 affixed to susceptor or support 12. Susceptor 12 is further provided with a temperature controlling device to heat the wafer to the desired temperature. The reaction chamber 11 is provided with an exhaust port 18 through which the reaction gas by-products and unreacted starting materials are exhausted. The chamber itself is pressure controlled to maintain a constant and desired reaction pressure. Generally this will be from 1 to 100 Torr.

The reacting gases themselves are fed to a reservoir 22 near the top of the reaction chamber where they are mixed. The mixed reactant gases 24 flow downwardly through a shower head dispenser toward the wafer 13 which is being rotated on the susceptor 12.

As indicated by the gas flow lines 24 in FIG. 2 and 2A, as the gas approaches the wafer surface it flows radially outward in a uniform manner over the entire wafer surface and down past the sides of the support toward the exhaust port 18.

The rotation of the wafer 13 acts as a pump forcing the reactant gases and formed gaseous by-products along the wafer surface to the exhaust 18. As shown more particularly in FIG. 2A, as the gas approaches the wafer surface it begins to change its direction from a downward direction to an outward direction 25. This begins at a distance above the wafer and, of course, ends along the wafer surface. The distance between the initiation of the change in direction of the gas flow and the wafer surface is referred to as the boundary layer and the thickness itself is the boundary layer thickness.

As will be described further, the present reactor is preferably operated under matched flow conditions. Matched flow means that the rate of gas flow in a downward direction indicated by Q−1 equals the rate of gas flow in a horizontal direction referred to as Q−2. When these two gas flow rates are equal, matched flow occurs.

Preferably the reaction conditions can be optimized by minimizing the boundary layer thickness. The boundary layer thickness is equal to $$\sqrt[4]{\frac{\text{kinematic viscosity}}{\text{rotational velocity}}}$$

The kinematic viscosity equals the viscosity of the reactor gas mixture divided by the density. Thus, the boundary layer thickness can be decreased by decreasing the kinematic viscosity which, in turn, is reduced by lowering the actual viscosity—in other words, changing diluent gases. Also, modifying the rotational velocity will decrease the boundary layer thickness. FIG. 4 is a graph showing the boundary layer thickness in centimeters as a function of the rotation rate for the given conditions stated. It is preferred to maintain the boundary layer at less than 4 cm, preferably at about 2.5 cm or less.

Generally at temperatures below 500° C. the rotational velocity should be from about 100 to about 1200 rpm (or higher). This should increase as temperatures decrease or viscosity increases. The reaction will continue until the desired film thickness is applied. Generally, this will be 30 to 180 seconds. An ammonia anneal for 30 seconds can be used to further reduce chlorine impurities.

Figure 3:
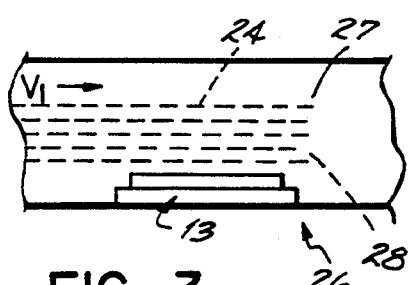
FIG. 3 is a diagramatic cross-sectional depiction of a laminar flow reactor broken away upstream and downstream of the reactor chamber.

In a laminar flow reactor 26, as shown in FIG. 3, the same reactant gases are passed through the reactor over the substrate 13. The gas enters at a speed $V_1$ and as it passes over the substrate 13 the gas 24 at the surface of the substrate has a velocity of zero. Above the wafer there is a point 27 where the velocity of the gas equals $V_1$. The boundary layer 28 in a laminar flow reactor is the area in which the velocity of the gas passing over the substrate is less than $V_1$. In the laminar flow reactor as in a rotating disk reactor, the boundary layer 28 should be minimized to increase efficiency. Preferably this will be less than 4 cm and most preferably less than 2 cm.

The invention will be further appreciated in light of the following example.

Example 1

Low temperature (450° C.) titanium nitride is deposited using a commercial single wafer rotating disk reactor. The chamber is an MESC-compatible process module attached to an MRC Galaxy-1000 ™ cluster tool. All wafers pass through two stages of vacuum before loading into the process chamber. The reaction wall temperature is controlled such that any reaction by-products or volatile gas inlet temperatures are regulated to prevent condensation.

The wafer is heated by a susceptor which rests on a three-zone resistive heater. Helium is introduced between the wafer back side and the susceptor to enhance the heat transfer. Thermal transfer is primarily conductive as the gap is smaller than the mean free path of the helium. There is a separate back side vacuum system to maintain the back side helium pressure below that over the front surface of the wafer. In this manner the wafer is retained in place solely by vacuum differential without the use of a clamp.

The process utilizes a reaction between titanium tetrachloride and ammonia. The gas flows were 15 sccm titanium tetrachloride, 50 sccm ammonia, and 5 slm of Nitrogen.

Figure 5:
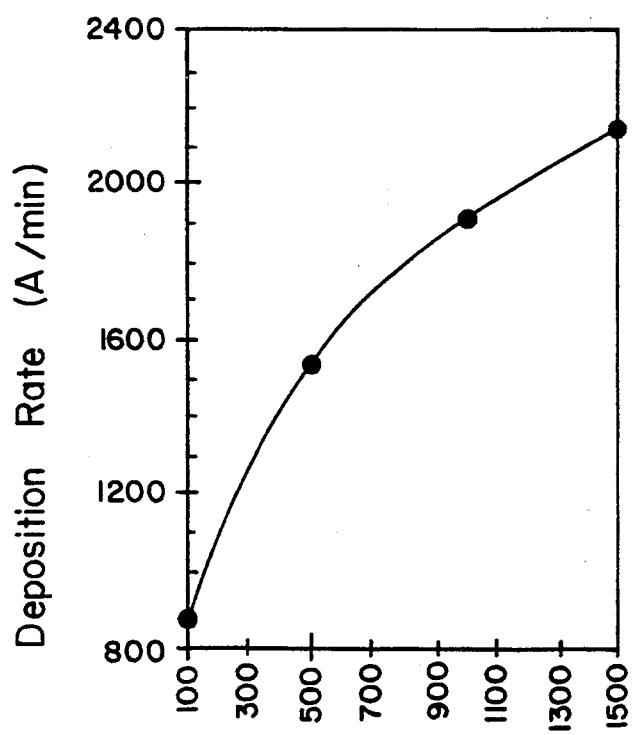
FIG. 5 is a graph depicting the deposition rate of TiN vs. rotation rate at a temperature of 450° C.

The deposition rate, as a function of rotational speed, was determined and is shown in FIG. 5.

The bulk chlorine content was measured at 1.1 atomic percent when deposited at 450° C. with the rotating disk system. (Without use of the rotating disc this would be 4–5 percent.)

Example 2

The boundary layer thickness for a 10 Torr process was determined at various rotational rates. These are shown in Table 1.

TABLE 1

| Tinf = 423.00 | Dsusc = 22.86 | Gr = 2875.31 |
| P = 10.00 | Ts = 723.00 | Dshwr = 15.24 |
| v = 18.999 | h = 10.16 | ε = 1 |

| Disc Rotation Rate Ω rpm | V cm/s | Q (sccm) Newman | Re | Gr/Re 1.5 | Matched Flow Rate Q (sccm) Schlichting | Bndary Layer Thickness δ (cm) |
| --- | --- | --- | --- | --- | --- | --- |
| 50 | 8.63 | 876 | 36.00 | 13.31 | 2015 | 7.620 |
| 100 | 12.44 | 1262 | 72.00 | 4.71 | 2849 | 5.388 |
| 150 | 15.27 | 1549 | 107.99 | 2.56 | 3490 | 4.400 |
| 200 | 17.64 | 1790 | 143.99 | 1.66 | 4030 | 3.810 |
| 250 | 19.72 | 2002 | 179.99 | 1.19 | 4505 | 3.408 |
| 300 | 21.61 | 2193 | 215.99 | 0.91 | 4935 | 3.111 |
| 350 | 23.34 | 2368 | 251.99 | 0.72 | 5331 | 2.880 |
| 400 | 24.95 | 2532 | 287.99 | 0.59 | 5699 | 2.694 |
| 450 | 26.46 | 2686 | 323.98 | 0.49 | 6044 | 2.540 |
| 500 | 27.89 | 2831 | 359.98 | 0.42 | 6371 | 2.410 |
| 550 | 29.26 | 2969 | 395.98 | 0.36 | 6682 | 2.298 |
| 600 | 30.56 | 3101 | 431.98 | 0.32 | 6979 | 2.200 |
| 650 | 31.80 | 3228 | 467.97 | 0.28 | 7264 | 2.113 |
| 700 | 33.00 | 3350 | 503.97 | 0.25 | 7539 | 2.037 |
| 750 | 34.16 | 3467 | 539.97 | 0.23 | 7803 | 1.968 |
| 800 | 35.28 | 3581 | 575.97 | 0.21 | 8059 | 1.905 |
| 850 | 36.37 | 3691 | 611.97 | 0.19 | 8307 | 1.848 |
| 900 | 37.42 | 3798 | 647.96 | 0.17 | 8548 | 1.796 |
| 950 | 38.45 | 3902 | 683.96 | 0.16 | 8782 | 1.748 |
| 1000 | 39.45 | 4003 | 719.96 | 0.15 | 9010 | 1.704 |
| 1100 | 41.37 | 4199 | 791.96 | 0.13 | 9450 | 1.625 |
| 1200 | 43.21 | 4386 | 863.95 | 0.11 | 9870 | 1.555 |
| 1300 | 44.98 | 4565 | 935.95 | 0.10 | 10273 | 1.494 |
| 1400 | 46.68 | 4737 | 1007.94 | 0.09 | 10661 | 1.440 |
| 1500 | 48.31 | 4903 | 1079.94 | 0.08 | 11035 | 1.391 |

[Dimensions in cm, P in Torr; T in K]

This shows a dramatic reduction in the boundary layer at a rotational velocity of 150–250 rpm.

In conclusion, rotation has been shown to improve the gas flow above the wafer surface and reduce the chlorine content by approximately 80%. The rotation results in a more than 300% increase in deposition rate. Further, there are significant advantages in maintaining the reaction temperature at less than 500° C. This creates less stress on the substrate and permits the process to be used on a wider range of substrates.

This has been a description of the present invention along with the preferred method of practicing the invention currently known, however, the invention itself should be defined by the appended claims wherein we claim:

1. A method of chemical vapor deposition of titanium nitride onto a semiconductor substrate surface comprising the steps of:
   passing a gaseous reaction mixture of titanium tetrachloride, ammonia and a diluent over said substrate surface;
   maintaining said substrate surface at a temperature of 200° C. to 500° C.; and
   establishing and maintaining a boundary layer of less than or equal to 4 cm over said substrate surface, thereby forming a layer of titanium nitride on said substrate surface.

2. The method claimed in claim 1 wherein said reactor is a rotating disk reactor and said titanium tetrachloride, ammonia and diluent are forced perpendicular to the substrate surface.

3. The method claimed in claim 2 wherein said substrate is rotated at a rate of about 150 to about 1500 rpm.

4. The method claimed in claim 2 wherein said diluent gas is selected from the group consisting of hydrogen, helium, argon and nitrogen.

5. The method claimed in claim 3 wherein said temperature is about 450° C.

6. The method claimed in claim 1 wherein said gas mixture is passed parallel to the surface of said substrate.

7. The method claimed in claim 6 wherein said temperature is maintained at about 450° C.

8. The method claimed in claim 7 wherein said diluent gas is nitrogen.

9. A method of chemical vapor deposition of titanium nitride onto a semiconductor substrate having a first surface and an opposite second surface, said method comprising the steps of
   forcing a gaseous reactant mixture of titanium tetrachloride, ammonia and a diluent downwardly against said first surface,
   heating said second surface to a temperature of 350° C. to 500° C., and
   rotating said substrate at a rate of 100 to 1500 rpm, maintaining a viscosity and flow rate of said gaseous reactant mixture to establish a boundary layer thickness of less than about 4 cm
   thereby forming a layer of titanium nitride on said first surface.

* * * * *